United States Patent
Chien et al.

(10) Patent No.: US 8,269,300 B2
(45) Date of Patent: Sep. 18, 2012

(54) APPARATUS AND METHOD FOR USING SPACER PASTE TO PACKAGE AN IMAGE SENSOR

(75) Inventors: Yeh-An Chien, Kaohsiung (TW); Wei-Feng Lin, Hsinchu (TW)

(73) Assignee: OmniVision Technologies, Inc., Santa Clara, CA (US)

( * ) Notice: Subject to any disclaimer, the term of this patent is extended or adjusted under 35 U.S.C. 154(b) by 431 days.

(21) Appl. No.: 12/111,763

(22) Filed: Apr. 29, 2008

(65) Prior Publication Data

US 2009/0267170 A1 Oct. 29, 2009

(51) Int. Cl.
*H01L 31/0203* (2006.01)
*H01L 31/18* (2006.01)

(52) U.S. Cl. ........ 257/434; 257/431; 257/432; 257/433; 257/E23.002; 257/E31.11; 257/E31.117

(58) Field of Classification Search .................. 257/431, 257/432, 433, E23.001, E23.002, E31.11, 257/434
See application file for complete search history.

(56) References Cited

U.S. PATENT DOCUMENTS

| | | | |
|---|---|---|---|
| 6,388,313 B1 | 5/2002 | Lee et al. | |
| 6,806,309 B2 | 10/2004 | Jaeger | |
| 6,856,357 B1 | 2/2005 | Stevenson | |
| 6,893,941 B2 * | 5/2005 | Suda | 438/455 |
| 6,995,462 B2 | 2/2006 | Bolken et al. | |
| 2003/0098912 A1* | 5/2003 | Hosokai et al. | 348/207.99 |
| 2004/0008417 A1* | 1/2004 | Shimizu et al. | 359/619 |
| 2004/0012698 A1* | 1/2004 | Suda et al. | 348/315 |
| 2004/0244192 A1 | 12/2004 | Hsin et al. | |
| 2005/0059188 A1 | 3/2005 | Bolken et al. | |
| 2006/0024856 A1* | 2/2006 | Derderian et al. | 438/57 |
| 2006/0044450 A1* | 3/2006 | Wolterink et al. | 348/340 |
| 2007/0098995 A1 | 5/2007 | Masuko et al. | |
| 2007/0120213 A1 | 5/2007 | Hiew et al. | |
| 2007/0166029 A1* | 7/2007 | Lee et al. | 396/529 |

FOREIGN PATENT DOCUMENTS

| | | |
|---|---|---|
| EP | 1816454 A | 8/2007 |
| EP | 1901123 A | 3/2008 |

OTHER PUBLICATIONS

International Search Report and Written Opinion issued in related PCT Patent Application Serial No. PCT/US2009/040679, dated Sep. 25, 2009, 24 pages.
Nikkei Electronics Asia—Tech-On! "Spacer-Filled Pastes Control Bondline," Jul. 2004, pp. 1-4, downloaded from http://techon.nikkeibp.co.jp/NEA/archive/200707/316498 on Apr. 28, 2008.

* cited by examiner

*Primary Examiner* — Peniel M Gumedzoe
(74) *Attorney, Agent, or Firm* — Lathrop & Gage LLP

(57) ABSTRACT

A packaged image sensor assembly utilizes a spacer paste to control the height of a transparent window above an image sensor die to provide safe wire bond clearance. A dam structure is used to control the height of the transparent window. The dam may be formed either entirely from spacer paste or by depositing the spacer paste on an underlying patterned mesa. An additional encapsulant is provided outside of the dam to encapsulate wirebonds and provide additional protection from moisture permeation.

10 Claims, 6 Drawing Sheets

APPARATUS AND METHOD FOR USING SPACER PASTE TO PACKAGE AN IMAGE SENSOR

FIELD OF THE INVENTION

The present invention is generally related to the packaging of image sensors to encapsulate wire bonds and protect the image sensor from moisture. More particularly, the present invention is directed towards a packaged image sensor assembly that includes a dam structure and that provides wire bond encapsulation.

BACKGROUND OF THE INVENTION

Image sensors utilize an array of photo-sensitive pixels to capture an optical image. One common type of image sensor is a Complementary Metal Oxide Semiconductor (CMOS) image sensor. There are a variety of techniques to package CMOS image sensors. However, one technique that is used is to mount the image sensor on a substrate (interposer) and to provide wire bond connections between the substrate and the image sensor. An additional transparent cover is often provided to protect the image sensor.

Reliability of the packaged image sensor is typically increased if the packaged assembly is encapsulated. One approach that is used in the prior art is to use an encapsulant (e.g., a liquid polymer) to simultaneously encapsulate the wire bonds and provide a moisture seal about the edges of the transparent cover. For example, FIG. 1 illustrates a packaged assembly 50 described in U.S. Pat. No. 6,995,462 having an interposer 30 (with external connection points 38 and solder balls 48), image sensor chip 4, transparent cover 22, wire bonds 44, and attachment pads 34. An encapsulant 46 (e.g., a silicon-filled polymer or liquid crystal polymer) encapsulates the wire bonds 44. In this package design a micro-lens 20 is disposed over a portion of the image sensor 4 that has an array of pixels. A liquid adhesive material 24 (such as a liquid epoxy or a liquid resin) is used to attach the transparent cover. However this structure has several drawbacks. Conventional liquid adhesives are difficult to control in regards to thickness and width. Thus, the width of the liquid adhesive is greater than desired, wasting space on the die and thereby increasing manufacturing costs. Additionally, only a comparatively small amount of encapsulant exists at the edges of the transparent cover. That is, at the edges of the transparent cover the liquid epoxy borders the encapsulant such that only a comparatively thin region of encapsulant provides moisture protection at the edge of the transparent cover.

FIG. 2 illustrates a film over wire structure that is a variation of the structure described in U.S. Pat. No. 6,388,313, assigned to Siliconware Precision Industries Co. Ltd (SPIL) of Taiwan. The SPIL CMOS image sensor package assembly includes an interposer to which an image sensor chip is mounted. A liquid adhesive film, such as a liquid resin film, is used to bond the transparent glass cover. However, it is difficult to accurately control the spreading of a large area liquid resin film due to resin bleed. That is, in addition to other drawbacks a film made of a liquid resin will tend to flow laterally across the edge of the die after an initial film deposition. As a result, this means that it is difficult to achieve a narrow gap between the pixel array edge and the die edge. This wastes die area which, in turn, results in greater manufacturing costs than desired. Additionally, moisture permeation of a liquid adhesive resin film is a reliability concern. In particular, there is a risk that moisture can permeate laterally through the resin film during the lifetime of the packaged image sensor.

Therefore in light of the above described problems an improved apparatus, system, and method to package an image sensor was developed.

SUMMARY OF THE INVENTION

A packaged image sensor assembly utilizes a spacer paste to control the height of a transparent window above an image sensor die to provide safe wire bond clearance. An image sensor die is mounted to an interposer and wire bonds are formed between the image sensor die and the interposer. A transparent cover is attached to the image sensor die using a dam formed from a spacer paste. The dam may be formed either entirely from spacer paste or from spacer paste dispensed on top of an underlying patterned mesa region. The spacer paste provides a uniform, low-tilt bonding surface having a controlled height above the surface of the image sensor to provide wire bond clearance. An additional encapsulant may be formed in a region outside of the dam in a region between the transparent cover and the interposer.

BRIEF DESCRIPTION OF THE FIGURES

The invention is more fully appreciated in connection with the following detailed description taken in conjunction with the accompanying drawings, in which.

Like reference numerals refer to corresponding parts throughout the several views of the drawings.

DETAILED DESCRIPTION OF THE INVENTION

Figure 1:
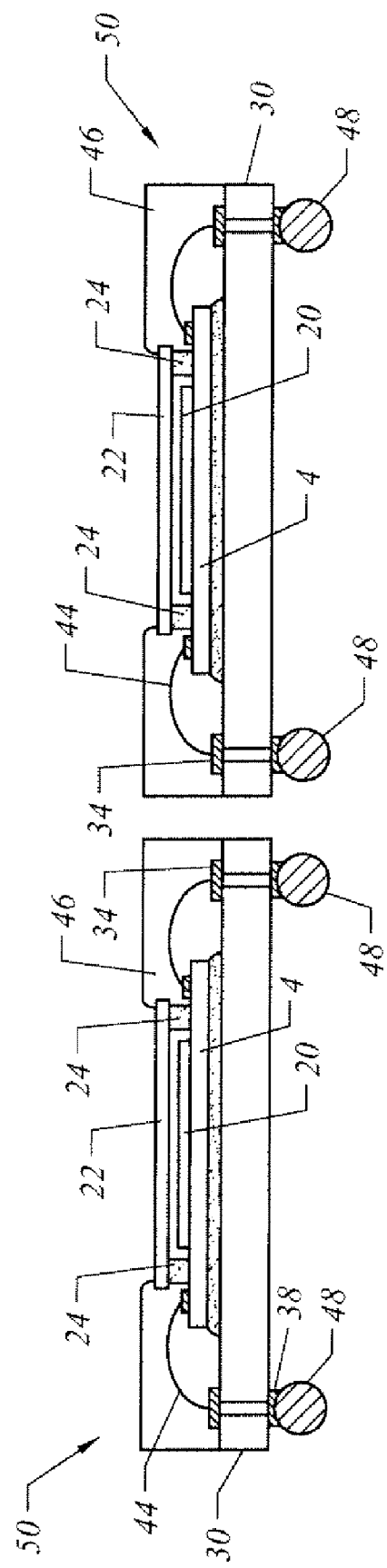
FIG. 1 illustrates a packaged image sensor in accordance with the prior art.
Figure 2:
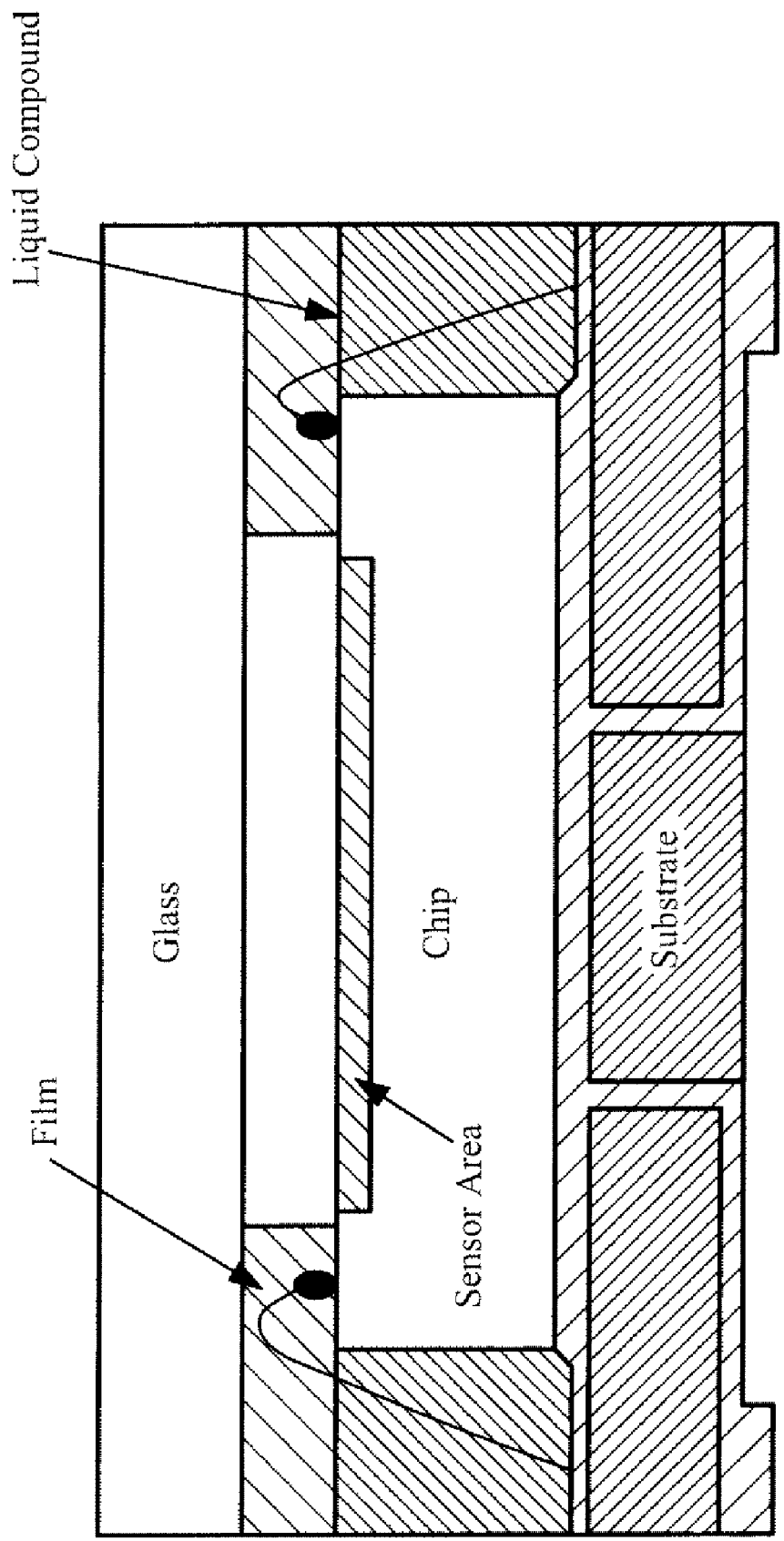
FIG. 2 illustrates a packaged image sensor in accordance with the prior art.
Figure 3A:
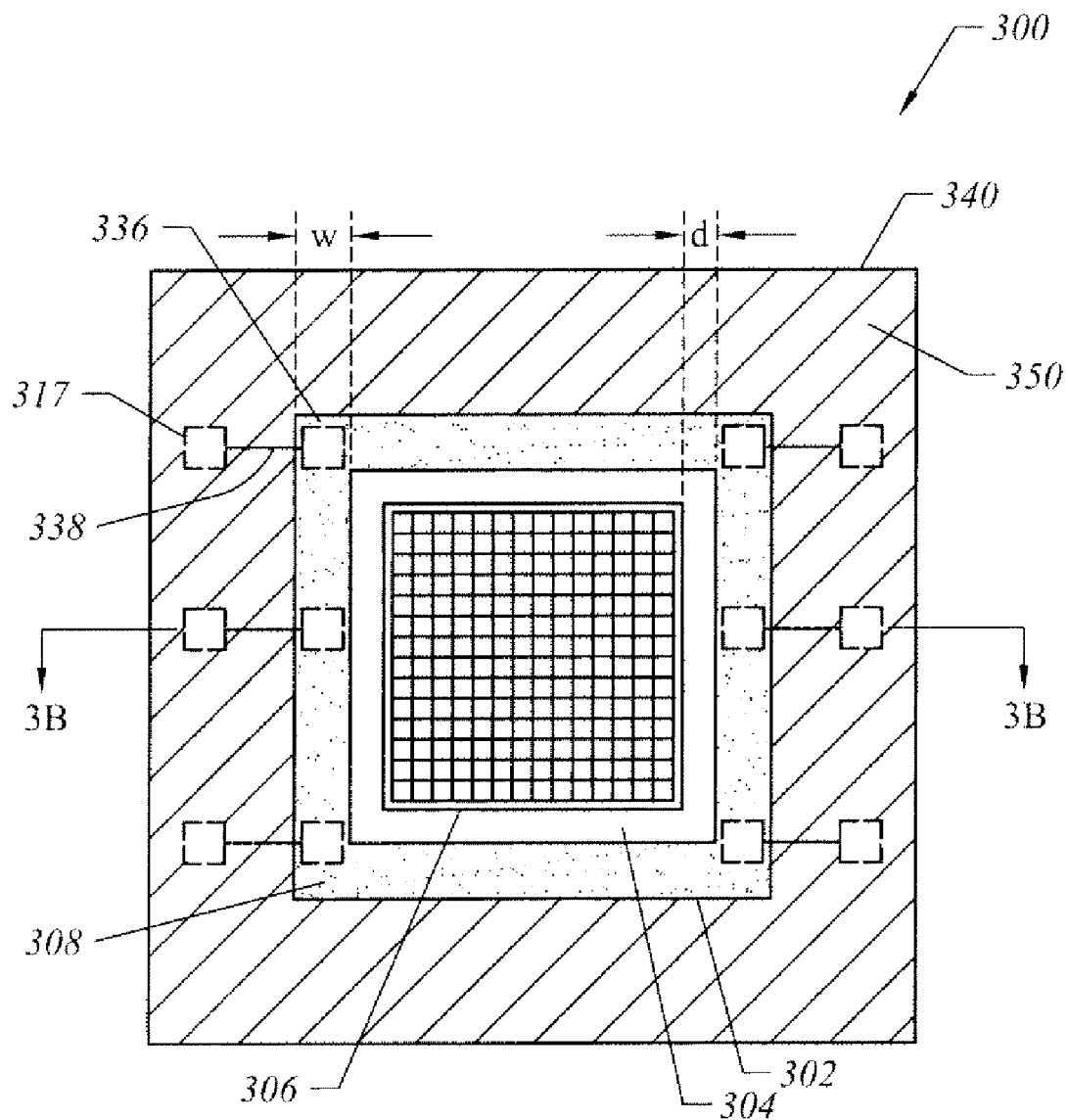
FIGS. 3A and 3B illustrate a packaged image sensor using a spacer paste to serve as a dam in accordance with one embodiment of the present invention.

FIG. 3A is a top view of a packaged image sensor 300 through a top transparent cover 340. The top transparent cover 340 permits light to reach an array of photo-sensitive pixels 306 located in a central portion 304 of an image sensor die 302, where the image sensor die 302 is an integrated circuit chip. An encapsulant 350 is formed under a peripheral portion of the transparent cover 340. A spacer paste dam 308 is formed by a spacer paste epoxy located on a peripheral edge portion of image sensor die 302 that does not obstruct the central portion 304 that contains the array of pixels 302. Dam 308 has a width, w. The array of pixels 306 may continue up to the boundary of dam 308 but more generally a slight offset, d, may be provided to account for manufacturing tolerances. Thus, the edge of the array of pixels 306 is inset from the edge of the image sensor die 302 by a total distance of: w+d. For the purposes of illustrating some aspects of the invention dashed lines (phantom lines) are used to indicate an exemplary number of embedded electrical connections formed by a plurality of wire bonds 338 between respective wire bond attachment regions 317 and wire bond contact pads 336.

Figure 3B:
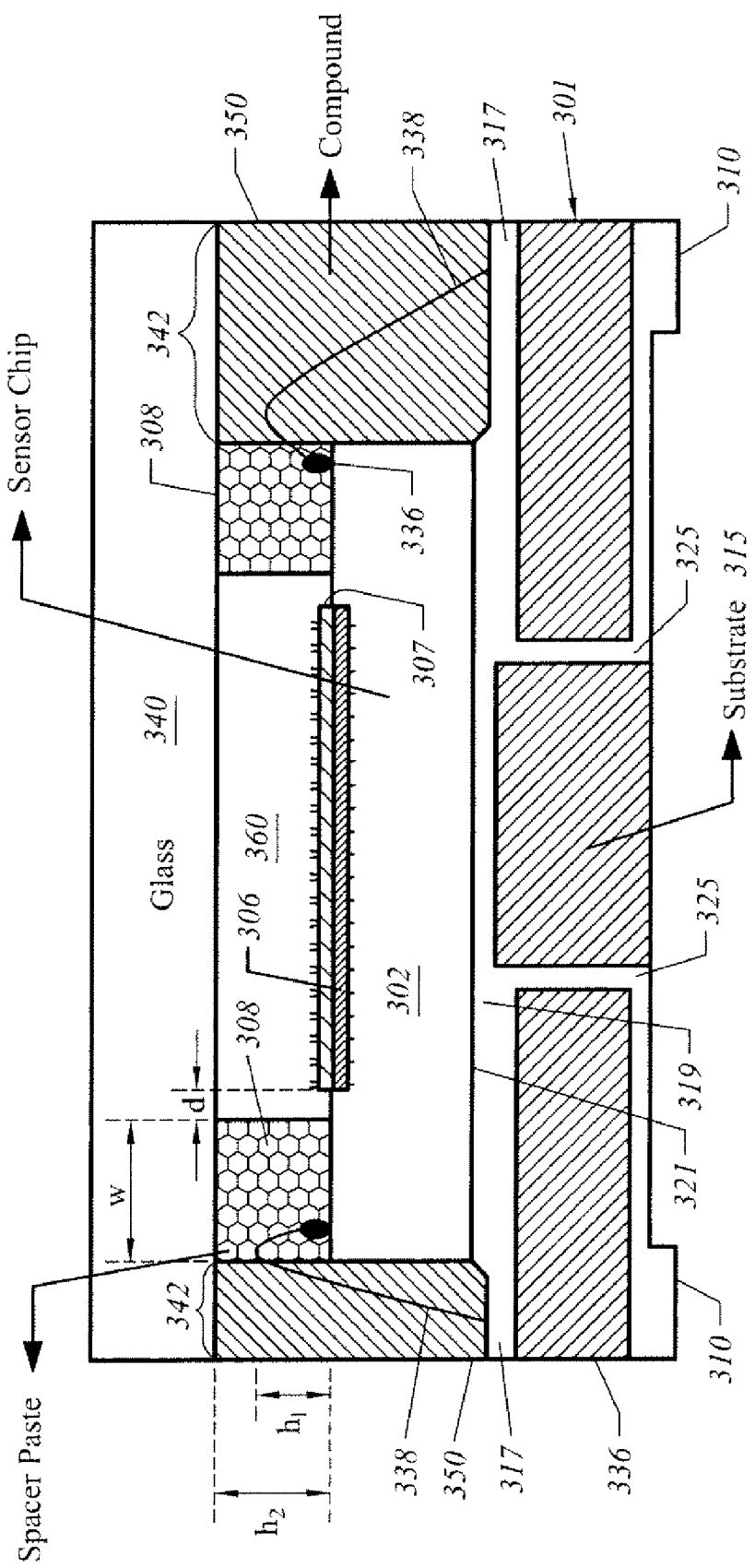

FIG. 3B is a cross sectional side view along line 3B-3B of FIG. 3A. A substrate 315 has a top surface with a die attachment region 319 and wire bond attachment regions 317. The substrate 315 is formed into an interposer 301 that include external contact regions 310 to make external electrical connections (e.g., using solder balls) Internal vias 325 support electrical connections between the external contact regions 310 and wire bond attachment regions 317. Image sensor die 302 has a bottom surface 321 attached to the die attachment portion 319.

A top surface 330 of the image sensor die 302 includes central portion 304 having the array of photo-sensitive pixels 306. Wire bonds 338 are formed between wire bond contact pads 336 on the image sensor die and wire bond attachment regions 317 on the substrate 315. Exemplary wire bonds are formed from gold wires. A reliable wire bond process typically requires that the wire not be bent too sharply. Consequently, a portion of the wire bonds 338 extends above the top surface 330 of the image sensor die 320 by a distance h1 that depends upon the curvature of the wire bonds and other factors. The image sensor die may also include a color filter array/microlens array 307 mounted on the central portion 304 portion of the image sensor die that has the array of pixels 306.

The transparent cover 340 (e.g., a glass cover) protects the image sensor die 302. In one embodiment transparent cover 340 extends over the image sensor die 302 and has overhangs 342 that extend over the wire bond attachment regions 317 of the substrate 315. The transparent cover 340 is attached to the image sensor chip by spacer paste dam 308 having a dam height, h2, and width w. In this embodiment the spacer paste serves as a dam 308 (with height h2 and width w) to improve process capability and reliability. The spacer paste is an adhesive that includes spacer spheres, as will be described below in more detail. Encapsulant 350 is provided to encapsulate the wire bonds and also provides protection against moisture permeation. In one embodiment encapsulant 350 is opaque (e.g., black) to provide additional optical isolation of the image sensor.

During assembly the spacer paste dam 308 is formed by dispensing spacer paste on the surface of the image sensor die 302. Dam 308 forms a cavity 360 between the top surface 330 of the image sensor die 320 and the transparent cover 340. The spacer paste dam 308 may cover a portion of the wire bonds 338 over wire bond contact pads 336. The cavity 360 may be an air-filled cavity or a cavity filled with an inert gas. A spacer paste dam 308 provides several advantages. First, the spacer paste dam 308 is consistent with a reliable package design that provides protection from moisture permeation. Second, the spacer paste dam 308 provides a controlled, uniform, low tilt bonding surface because the spacers control the height of the bonding surface around the entire dam. Additionally, the spacer paste thickness h2 can be selected to provide a controlled safe wire bond clearance that includes the minimum distance h1 required to accommodate a reliable wire bonding process plus an additional manufacturing/reliability safety margin (h2–h1). That is, the cavity height can be controlled to be a distance greater than some minimum wire bond clearance height by a sufficient margin so that the transparent cover 340 does not press into the wire bonds and damage them during assembly, testing and/or the lifetime of the packaged assembly. In one embodiment a clearance height, h2, is selected to be at least 60 microns.

The use of a spacer paste to form a dam 308 provides improved control over dam height and dam width. Spacer pastes are a special type of adhesive that has a base adhesive and that further includes a selected percentage of polymer organic spheres to serve as spacers. The size of the diameter of the polymer organic spacer spheres can be selected to control the height, h2, of the dam. The time-temperature-pressure cure process for a spacer paste is typically similar to that of the base adhesive paste. A low-bleed base adhesive is preferably selected. An exemplary organic spacer paste, such as those manufactured by Henkel Technologies of Dusseldorf Germany, includes polymethylmethacrylate (PMMA) spheres. The organic polymer spheres have a diameter sized within a specific range using a sieve process such that the spheres have an average spacer size within some statistical distribution. Spacer sizes are conventionally specified in terms of mils, where one mil is 25.4 microns. Thus, a spacer paste has organic polymer spacers sized to one nominal average spacer size, such as one mil, one and a half mils, two mils, three mils, etc. One technique to apply a spacer paste is using a needle having an internal diameter sufficiently greater than the spacer size to permit the spacer paste to be dispensed using reasonable pressures. For example, Henkel Technologies recommends that the diameter of the aperture of a dispensing needle be at least five times the spacer size. Thus the selection of a larger spacer size will increase cavity height h2 but also tend to increase the dam width, since a larger needle aperture will be required to dispense the spacer paste.

The packaged assembly also provides improved protection against moisture permeation. Encapsulant 350 extends completely between the interposer 301 and the transparent cover 340 in a region outside of the dam 308. Thus, the image sensor die 320 is protected from moisture permeation by two protective regions. First, encapsulant 350, which extends completely between the transparent cover 340 and substrate 315 under overhang 342, provides a primary outer barrier against moisture permeation. Thus moisture permeation is blocked on the top by the transparent cover and from the sides by a substantial thickness of encapsulant under overhangs 342. Second, the dam region of spacer paste 308 provides an additional inner barrier as a secondary barrier against moisture permeation.

The embodiment of FIGS. 3A-3B may be fabricated in a wafer-level packaging process in which a large number of image sensor die are packaged on a common interposer substrate and then separated after fabrication. An exemplary process flow includes the following steps. First, an image sensor wafer is provided that includes a color filter array/microlens array. The image sensor wafer is sawed into individual die. The individual die are attached to a substrate (i.e., attached to different portions of an interposer formed from a substrate wafer). Wire bonds are formed for individual die. The spacer paste is then dispensed to form a dam about the edges of each image sensor die. The transparent cover is then attached. The attachment process will depend, in part, on the base adhesive of the spacer paste. In particular the temperature and pressure to cure the spacer paste will depend on the base adhesive. The wire bonds are then encapsulated, preferably with an encapsulant that is a black compound (to provide optical isolation). As one example, a liquid underfill encapsulant may be used that flows in the open spaces underneath the transparent cover (exterior to the dams, which prevent the encapsulant from flowing across the pixel arrays). The encapsulant is then cured. A final saw step is performed to separate individual packaged devices.

An exemplary wire bond clearance distance, h2, required between the top of the image sensor and the bottom of the transparent cover (for the wire bonds) is about 60 microns. However, as previously described, commercially available spacer pastes typically have spacer sizes specified in mils, not microns. An exemplary process for the embodiment of FIG. 4 utilizes a spacer paste having a spacer size of three or four mils, or of at least 75 microns, to provide greater than 60 microns of clearance. However, note that a typical dispensing process utilizes a needle having an internal aperture diameter that is larger than the spacer size by a sufficient factor to prevent clogging and permit a smooth flow of spacer paste with reasonable pressure. In particular, Henkel Technologies recommends that the internal aperture size of the dispenser be at least five times that of the spacer. Consequently, the dispensing process will tend to increase the width of the dispensed spacer paste by at least the same aperture diameter factor. Additionally, after the spacer paste is dispensed it will have an edge that is not perfectly smooth (due to the spheres) and some minimal amount of spreading (bleeding) may occur after dispensing and during a curing process. Experiments indicate that for a spacer size of three mils (approximately 75 microns) the width can be controlled to about 450 microns using a conventional dispensing and curing process. Thus in this example a packaged image sensor could have the pixel array extending to as close as 450 microns of the die edge, if desired, while providing a 75 micron high region (h2) to allow for safe wire bond clearance. This superior control over the distance between the edge of the pixel array and the die edge results in more efficient use of die area, resulting in improved manufacturing costs.

Figure 4A:
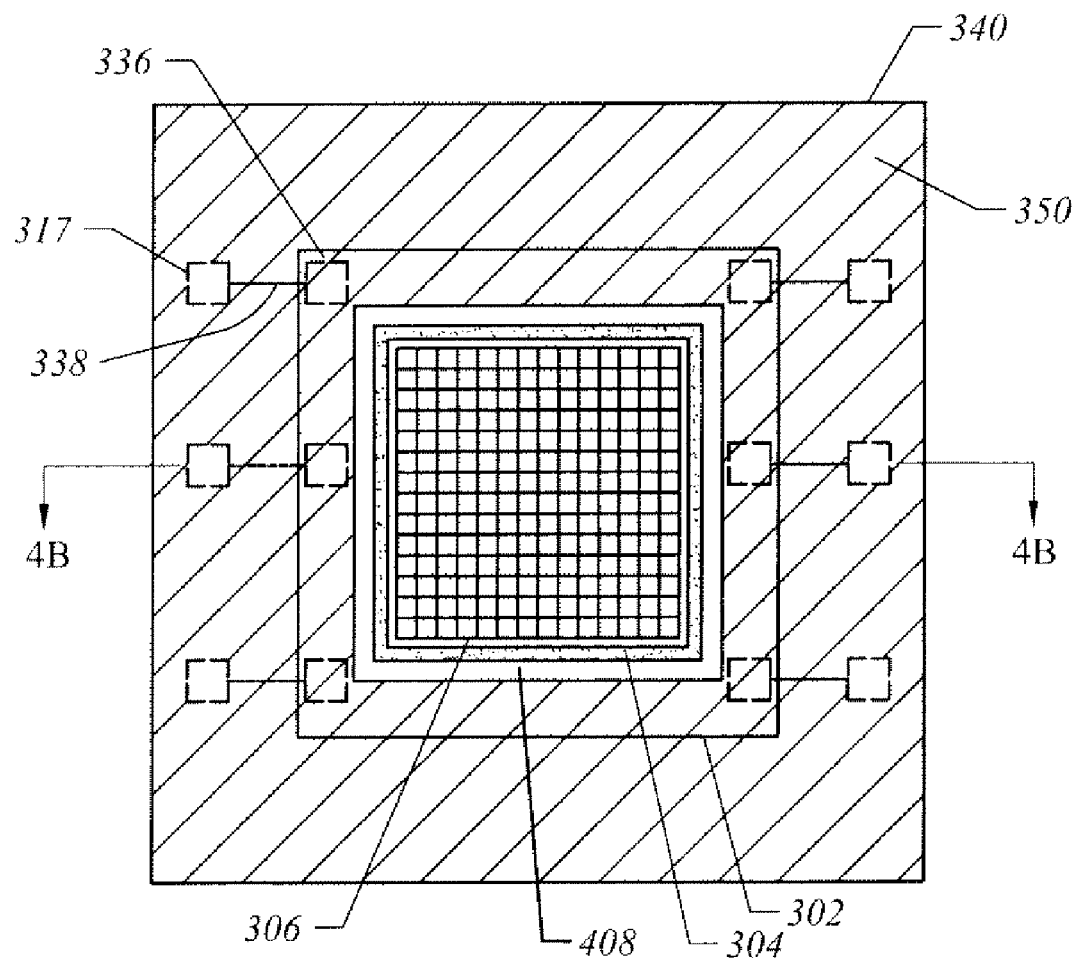
FIGS. 4A and 4B illustrate a packaged image sensor using a combination of a spacer paste and a patterned mesa layer to serve as a dam in accordance with one embodiment of the present invention.
Figure 4B:
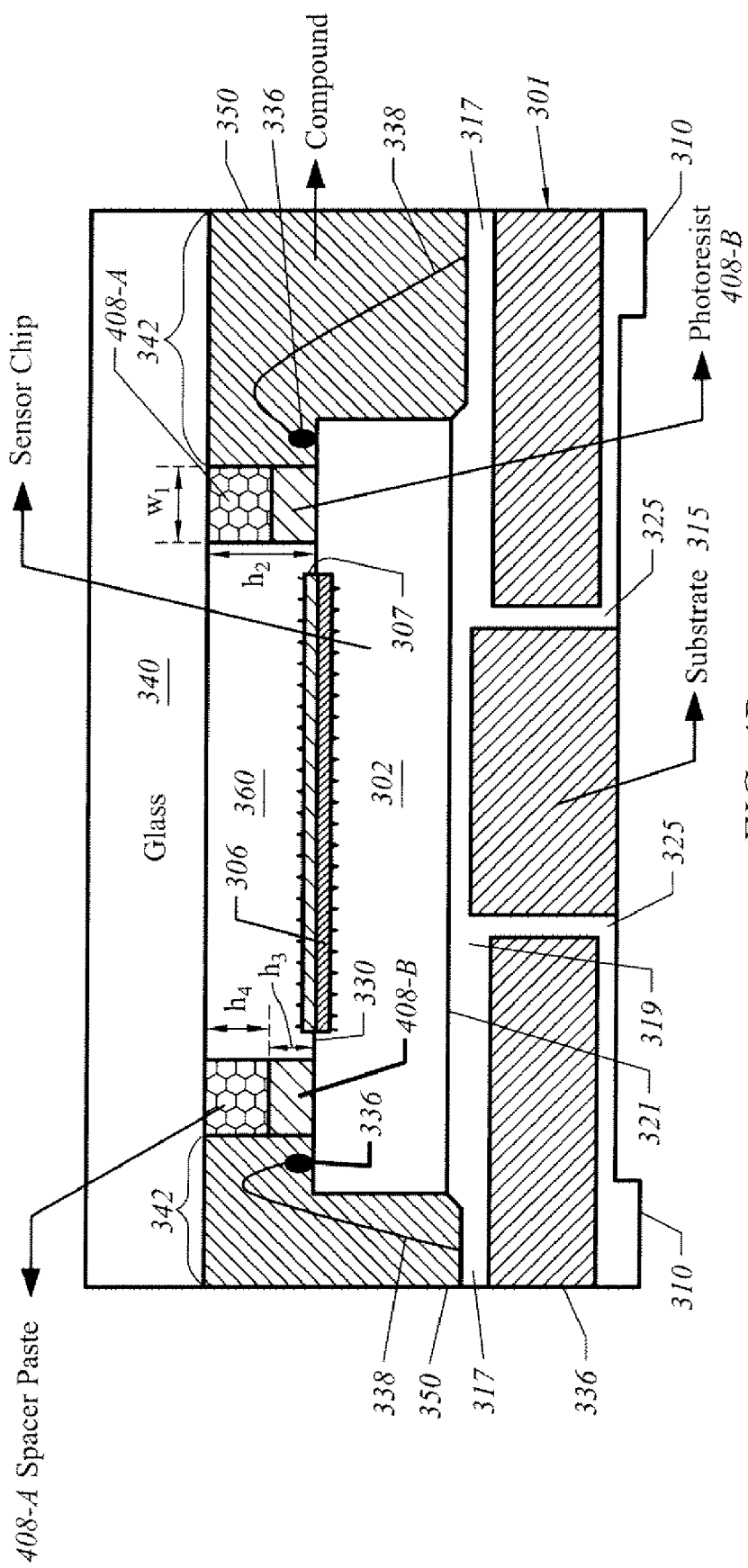

FIG. 4A illustrates a top view of an embodiment that permits a smaller spacer size to be used. FIG. 4B is a cross-sectional view along line 4B-4B. The embodiment is similar to that previously described except that a dam 408 is formed from a region of spacer paste 408-A dispensed on top of an underlying patterned mesa region 408-B to reduce the required spacer size. Patterned mesa region 408-B is a dam-shaped region formed on top of the image sensor die and thus extends above the surface of the image sensor die by a height h3. The spacer paste region 408-A is deposited on top of patterned mesa region 408-B to increase the height by an additional distance h4 to complete the dam 408. Thus to achieve a total clearance height h2, the required spacer paste thickness is: h4=h2−h3. For the purposes of illustration, regions 408-A and 408-B are illustrated as being in perfect alignment. More generally, perfect alignment is not required. For example, spacer paste region 408-A could be dispensed to have an initial width somewhat less than the underlying patterned mesa region 408-B. The patterned mesa region 408-B does not cover the center portion 304 and also does not cover solder bond contact regions 336 (to permit wire bonds to be formed). Consequently, in one embodiment the wire bonds 338 and solder bond contact pads 336 are embedded by encapsulant 350.

An advantage of using a dam 408 that includes an underlying mesa region 408-B is that it permits a reduction in the spacer size of the spacer paste region 408-A, which in turn permits a reduction in dam width. In this example a dam width, w1, is required to achieve a desired clearance, h2, for wire bonds 338. However, the minimum dam width will in large part be determined by the minimum width required for the thickness h4 of spacer paste region 408-A, which depends on spacer size. As an illustrative example, if a clearance height h2 above the top of the die surface for safe wire bond clearance is 60 microns, this height requirement can be satisfied by having approximately half of the necessary height provided by patterned mesa region 408-A with the rest being provided by spacer paste region 408-A. This could be achieved with a 37 micron high patterned mesa region 408-B onto which is dispensed a 1.5 mil (approximately 38 micron spacer diameter) spacer paste region 408-A to provide approximately 75 microns of clearance. As previously described, the spacer paste dispensing process utilizes an aperture having a diameter that scales with spacer size. Thus in this example the width, w1, of the dam (patterned mesa region plus 1.5 mil spacer paste stacked on top to reach a pre-selected height h2) is somewhat less than half that if the dam was formed only from spacer paste having a spacer size of 3 mils. This permits a potential reduction in the distance in the width between the edge of the pixel array and the die edge, thereby improving manufacturing costs.

As with the previously described example, the embodiment of FIGS. 4A-4B also provides excellent protection against moisture permeation. The complete layer of encapsulant 350 under transparent cover 340 surrounding dam 408 has a substantial width and provides a primary barrier against moisture permeation with the dam 408 providing a secondary barrier against moisture permeation.

The patterned mesa region 408-B is formed from a layer of material capable of being deposited on an image sensor wafer and patterned by a photolithographic process prior to splitting image sensor wafer into individual die. The patterned mesa region 408-B is preferably a layer of photosensitive material that is directly patterned using photolithography and which is further capable of being processed into a stable state using a comparatively low temperature process that will not significantly degrade the electrical and optical characteristics of the image sensor die. For example, certain types of photoresists (such as certain photo-polymers) can be deposited on a wafer in comparatively thick layers (e.g., up to about 40 microns thick), patterned, and then cured using a low-temperature process.

The embodiment of FIGS. 4A-4B may also be fabricated in a wafer-level packaging process in which a larger number of image sensor die are packaged on a common interposer substrate and then separated. An exemplary process is a follows. First, an image sensor wafer is provided that includes a color filter array/microlens array. The patterned mesa region is formed by using a photoresist coating process, exposure, development, and baking process. The image sensor wafer is sawed into individual die. The individual die are attached to a substrate (i.e., an interposer formed from a substrate wafer). Wire bonds are formed for individual die. The spacer paste is then dispensed on the patterned mesa layers to form dams about the edges of each image sensor die. The transparent cover is then attached. The attachment process will depend, in part, on the base adhesive of the spacer paste. In particular the temperature and pressure to cure the spacer paste will depend on the base adhesive. The wire bonds are then encapsulated, preferably with an encapsulant that is a black compound (to provide optical isolation). As one example, a liquid underfill encapsulant may be used that flows in the open spaces (exterior to the dams) underneath the transparent cover. The encapsulant is then cured. A final saw step is performed to separate individual packaged devices.

The foregoing description, for purposes of explanation, used specific nomenclature to provide a thorough understanding of the invention. However, it will be apparent to one skilled in the art that specific details are not required in order to practice the invention. Thus, the foregoing descriptions of specific embodiments of the invention are presented for purposes of illustration and description. They are not intended to be exhaustive or to limit the invention to the precise forms disclosed; obviously, many modifications and variations are possible in view of the above teachings. The embodiments were chosen and described in order to best explain the principles of the invention and its practical applications, they thereby enable others skilled in the art to best utilize the invention and various embodiments with various modifications as are suited to the particular use contemplated. It is intended that the following claims and their equivalents define the scope of the invention.

The invention claimed is:

1. A packaged device assembly, comprising:
   an interposer having a die attach region in a first portion of a first surface of the interposer and wire bond attachment regions disposed in a second portion of the first surface of the interposer;
   an image sensor die having a bottom surface and an opposed top surface, the bottom surface mounted to the die attach region of the interposer and the top surface having an array of pixels in a central region of the image sensor die and wire bond contact pads in an edge region peripheral to the array of pixels;
   wire bonds to provide electrical connections between individual wire bond attachment regions on the interposer and wire bond contact pads of the image sensor, the wire bonds having a curvature such that the wire bonds extend above the top surface of the image sensor die;
   a transparent cover attached to the top surface of the image sensor via a spacer paste having spacers that are organic polymer spheres, the spacer paste being dispensed in a region of said top surface exterior to said central region on said top surface of said image sensor die to form a dam about the array of pixels with the dam further forming a cavity about the central region between the transparent cover and the top surface of the image sensor die, the transparent cover extending over the image sensor die and including overhangs extending over the wire bond attachment region; and
   an encapsulant formed underneath the transparent cover in a region exterior to the cavity and the dam to encapsulate the wire bonds;
   the dam having a dam height above the top surface of the image sensor die, the dam structurally configured to allow safe clearance of the wire bonds under the transparent cover, and the dam encapsulating a portion of the wire bonds extending above the top surface of the image sensor die,
   wherein the dam is comprised substantially of only the spacer paste on the top surface, and the dam height being substantially equal to the size of the polymer spheres.

2. A packaged device assembly, comprising:
   an interposer having a die attach region in a first portion of a first surface of the interposer and wire bond attachment regions disposed in a second portion of the first surface of the interposer;
   an image sensor die having a bottom surface and an opposed top surface, the bottom surface mounted to the die attach region of the interposer and the top surface having an array of pixels in a central region of the image sensor die and wire bond contact pads in an edge region peripheral to the array of pixels;
   wire bonds to provide electrical connections between individual wire bond attachment regions on the interposer and wire bond contact pads of the image sensor, the wire bonds having a curvature such that the wire bonds extend above the top surface of the image sensor die;
   a transparent cover attached to the image sensor die via a region of a spacer paste disposed about the periphery of the image sensor die in a region excluding said central region containing said pixel array, the region of spacer paste having organic polymer spheres and a thickness sufficient to provide safe clearance of the wire bonds under the transparent cover; and
   an underlying patterned mesa region underneath the region of spacer paste, and on the image sensor die, a combined height of the underlying patterned mesa region and the region of spacer paste being greater than the thickness of the region of spacer paste between the image sensor die and the transparent cover.

3. The packaged device assembly of claim 2, further comprising an optically opaque encapsulant formed underneath the transparent cover in region exterior to the cavity and the dam to encapsulate the wire bonds.

4. The packaged device assembly of claim 2, wherein said dam does not cover said wire bond attachment regions.

5. The packaged device assembly of claim 2, wherein the thickness of the region of spacer paste between the underlying patterned mesa region and the transparent cover is substantially equal to the size of one of the polymer spheres.

6. The packaged device assembly of claim 2, wherein a width of the region of spacer paste is approximately six times the size of one of the polymer spheres.

7. The packaged device assembly of claim 1, wherein the dam has a dam width substantially equal to six times the size of one of the polymer spheres.

8. The packaged device assembly of claim 2, wherein the underlying patterned mesa region comprises a layer of photosensitive material.

9. The packaged device assembly of claim 8, wherein the layer of photosensitive material directly contacts the top surface of the image sensor die.

10. The packaged device assembly of claim 2, wherein the underlying patterned mesa region has a width, in a direction of a plane of the top surface of the image sensor die, substantially greater than a width of the region of spacer paste.

* * * * *